(12) United States Patent
Brandenburg et al.

(10) Patent No.: US 7,561,436 B2
(45) Date of Patent: Jul. 14, 2009

(54) CIRCUIT ASSEMBLY WITH SURFACE-MOUNT IC PACKAGE AND HEAT SINK

(75) Inventors: Scott D. Brandenburg, Kokomo, IN (US); Bruce A. Myers, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 200 days.

(21) Appl. No.: 11/160,015

(22) Filed: Jun. 6, 2005

(65) Prior Publication Data

US 2006/0274512 A1 Dec. 7, 2006

(51) Int. Cl.
*H05K 7/00* (2006.01)
(52) U.S. Cl. .................. 361/760; 257/712; 257/718
(58) Field of Classification Search .......... 257/706, 257/678, 712, 38, 718, 690; 29/840; 361/386, 361/760
See application file for complete search history.

(56) References Cited

U.S. PATENT DOCUMENTS

| | | | |
|---|---|---|---|
| 4,598,167 A | 7/1986 | Ushifusa et al. | |
| 4,698,663 A | 10/1987 | Sugimoto et al. | |
| 4,849,856 A * | 7/1989 | Funari et al. | 361/719 |
| 5,533,256 A * | 7/1996 | Call et al. | 29/840 |
| 5,592,735 A | 1/1997 | Ozawa et al. | |
| 5,608,610 A | 3/1997 | Brzezinski | |
| 5,785,799 A * | 7/1998 | Culnane et al. | 156/379.7 |
| 5,990,552 A * | 11/1999 | Xie et al. | 257/718 |
| 6,180,436 B1 | 1/2001 | Koors et al. | 438/117 |
| 6,184,580 B1 * | 2/2001 | Lin | 257/712 |
| 6,262,489 B1 | 7/2001 | Koors et al. | 257/784 |
| 6,873,043 B2 | 3/2005 | Oman | 257/703 |
| 7,038,311 B2 * | 5/2006 | Woodall et al. | 257/706 |
| 2001/0050843 A1 | 12/2001 | Ueno et al. | |
| 2003/0198022 A1 | 10/2003 | Ye et al. | |
| 2005/0040518 A1 | 2/2005 | Brandenburg et al. | 257/712 |
| 2005/0078456 A1 | 4/2005 | Mandel et al. | 361/719 |

FOREIGN PATENT DOCUMENTS

| | | |
|---|---|---|
| DE | 198 59 739 | 7/2000 |
| DE | 203 01 773 | 4/2003 |
| EP | 0 515 094 | 11/1992 |

(Continued)

OTHER PUBLICATIONS

European Search Report dated Oct. 27, 2008.

*Primary Examiner*—Dean A. Reichard
*Assistant Examiner*—Andargie M Aychillhum
(74) *Attorney, Agent, or Firm*—Jimmy L. Funke

(57) ABSTRACT

A circuit assembly containing a surface mount (SM) IC package wire bonded to a substrate and configured to conduct heat from the package into a heat sink through a heat-conducting member instead of the substrate. The package contains an IC device with input/output pads on a surface thereof that are connected with leads to conductors on the substrate. The heat sink is located adjacent the package so as not to be separated from the package by the substrate. The heat-conducting member is positioned adjacent the surface of the device opposite its input/output pads, and is bonded to the device and heat sink to provide a heat path between the package and heat sink that does not pass through the substrate.

4 Claims, 3 Drawing Sheets

FOREIGN PATENT DOCUMENTS

| | | |
|---|---|---|
| EP | 0 907 307 | 4/1999 |
| GB | 2 279 807 | 1/1995 |
| JP | 4-168753 | 6/1992 |
| JP | 2000-223810 | 8/2000 |
| JP | 2002-359464 | 12/2002 |
| JP | 2003-163458 | 6/2003 |
| JP | 2004-87989 | 3/2004 |

* cited by examiner

CIRCUIT ASSEMBLY WITH SURFACE-MOUNT IC PACKAGE AND HEAT SINK

BACKGROUND OF THE INVENTION

The present invention generally relates to surface mount (SM) integrated circuit (IC) devices. More particularly, this invention relates to thermal management of circuit assemblies containing one or more SM IC packages.

IC devices generate heat during their operation, resulting in increased junction temperatures for the devices. Because IC reliability and function are adversely affected by high junction temperatures, various techniques for removing heat from IC devices have been proposed. One approach entails the use of a thermally-conductive substrate or a substrate structurally modified to promote its heat conduction capability. For example, heat-generating semiconductor devices, such as power flip chips and SM packages, are often mounted to alumina substrates that conduct and dissipate heat in the vertical direction beneath the device.

Another approach used with SM IC packages is represented in FIG. 1, and involves an IC package 114 containing a metal slug 116 that conducts thermal energy from the package 114 to a substrate 112 beneath the package 114. Heat can then be removed from the substrate 112 by conduction into a separate heat sink 118 (such as the product case) contacting the backside of the substrate 112 opposite the package 114. As is conventional, FIG. 1 shows the input/output (I/O) pads 122 of the device 120 on the surface of the device 120 opposite the PCB substrate 112 and wire bonded to signal lines (not shown) on the substrate 112. The metal (e.g., copper) slug 116 is soldered to the side of the device 120 facing the PCB substrate 112 (i.e., opposite the I/O pads 122). In the case where the substrate 112 is a printed circuit board (PCB) with limited thermal conductivity, heat removal from the IC device 120 must often be promoted through the use of through-hole vias 124, which are shown as thermally contacting the heat sink 118 through a thermally conductive compound 126.

More recently, commonly-assigned U.S. Pat. Nos. 6,180, 436, 6,262,489, and 6,873,043 and U.S. Patent Application Publication Nos. 2005/0040518 and 2005/0078456 teach thermal management techniques compatible with flip chips on PCB's by making use of heat sinks with pedestals that contact the back side of the flip chip, i.e., the surface of the chip opposite the surface on which its microcircuitry is formed. As evident from FIG. 1, such an approach cannot be used with SM packages because of the presence of the I/O pads 122 and bond wires on the side of the package opposite the substrate 112.

BRIEF SUMMARY OF THE INVENTION

The present invention provides a circuit assembly containing a surface mount (SM) IC package soldered to a substrate and configured to conduct heat from the package into a heat sink through a heat-conducting member and not through the substrate. The invention is particularly adapted for SM IC's mounted to PCB circuit boards that exhibit low thermal conductivity, and can be used with SM IC packages having backside electrical contacts.

The circuit assembly includes a substrate having oppositely-disposed first and second surfaces and conductors on the first surface, and at least one surface mount package on the first surface of the substrate. The package contains an integrated circuit device with input/output pads on a first surface thereof, an oppositely-disposed second surface, and leads connecting the input/output pads to the conductors on the first surface of the substrate. A metal heat sink is located adjacent the package so as not to be separated from the package by the substrate. Finally, a heat-conducting member is positioned adjacent the second surface of the circuit device and bonded to the circuit device and heat sink to provide a heat path between the package and heat sink that does not pass through the substrate. As such, the substrate can be a PCB or other relatively low-conductivity substrate material without limiting the thermal management of the circuit device.

Other objects and advantages of this invention will be better appreciated from the following detailed description.

DETAILED DESCRIPTION OF THE INVENTION

Figure 1:
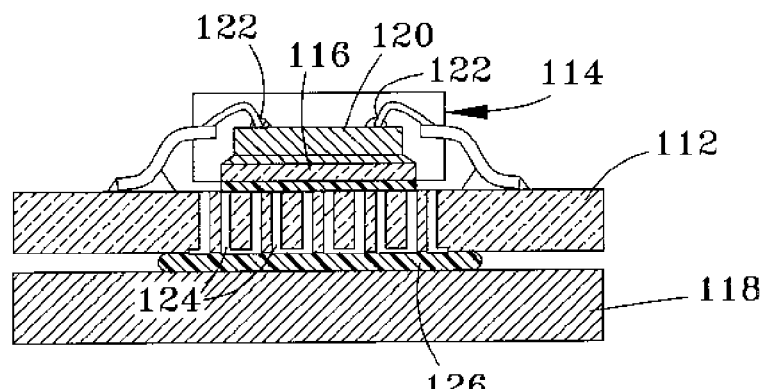
FIG. 1 is a cross-sectional view depicting a surface mount IC package with a heat conductor (metal slug) located between the package and its substrate for thermal management of the package in accordance with prior art practice.

FIGS. 2 through 8 represent circuit assemblies 10, 110, 210, 310, and 410 in accordance with different embodiments of this invention. Each circuit assembly 10, 110, 210, 310, and 410 is shown as including a SM IC package 14, in which is contained an IC device 20 of any type suitable for SM packaging. Each device 20 is shown as having input/output (I/O) pads 22 electrically connected with wirebonds and leads 38 to conductors (not shown) on a surface 28 of a substrate 12, which may be a thin laminate PCB or any other suitable substrate material. The orientation of the device 20 to the substrate 12 can be the conventional with its I/O pads 22 located on a surface 32 of the device 20 facing away from the substrate 12 (FIG. 2), or can be unconventional with the surface 32 carrying the I/O pads 22 facing the substrate 12 (FIGS. 3-5 and 8). In all cases, heat generated by the device 20 is conducted from the package 14 through a heat conductor 16, which is preferably in the form of what is commonly called a slug. As such, the heat conductor 16 can be a metal plate, such as aluminum, copper, or another material with similar thermally conductivity. The heat conductor 16 contacts and is preferably bonded with solder 36 to the surface 34 of the device 20 opposite the I/O pads 22 to provide a highly thermally conductive path to a heat sink 18 adjacent the package 14. The heat conductor 16 can be bonded directly or indirectly to the heat sink 18 with a thermally-conductive adhesive or solder, so that the conductive path does not pass through the substrate 12 and avoids the prior practice of through-hole vias (e.g., 124 of FIG. 1).

Figure 2:
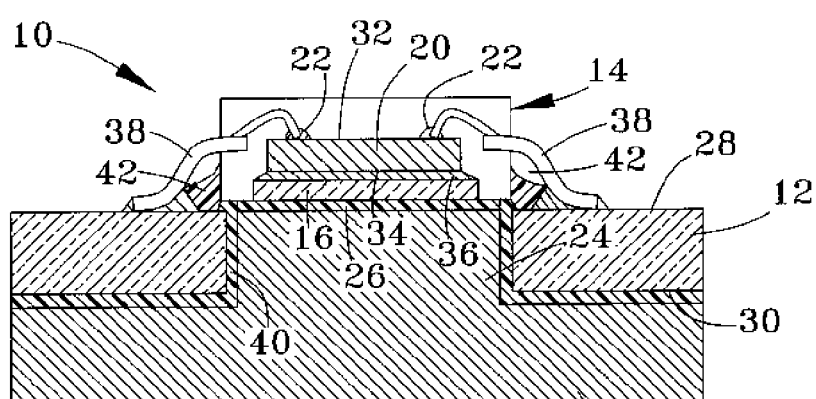
FIG. 2 is a cross-sectional view depicting a surface mount IC package with a heat conductor located between the package and a through-substrate heat sink pedestal for thermal management of the package in accordance with a first embodiment of the present invention.

Referring to FIG. 2, the package 14 is shown as being mounted over a through hole 40 formed in the substrate 12. The heat sink 18 is located adjacent the lower surface 30 of the substrate 12 opposite the package 14, and includes a pedestal 24 that projects up through the hole 40 and engages the heat conductor 16. The facing surface of heat conductor 16 is aligned with and preferably bonded to the heat sink pedestal 24 with a thermal contact material 26. The interface between the heat conductor 16 and pedestal 24 is not required to be electrically conductive. Therefore, while the thermal contact material 26 may be solder such as indium or an indium alloy, a thermal adhesive may also be used. Suitable thermal adhesives contain an adhesive matrix material (e.g., an epoxy or silicone) and a dispersion of metal and/or ceramic particles.

Because the package 14 is bonded to the substrate 12 through the leads 38 and bonded to the heat sink 18 through the heat conductor 16, it may be desirable to also bond the package 14 directly to the substrate 12 to increase the solder joint interconnect life of the solder bonding the leads 38 to the substrate 12. For this purpose, FIG. 2 depicts an adhesive 42 deposited to encapsulate the lead solder joints and extend up along the sides of the package 14.

Figure 3:
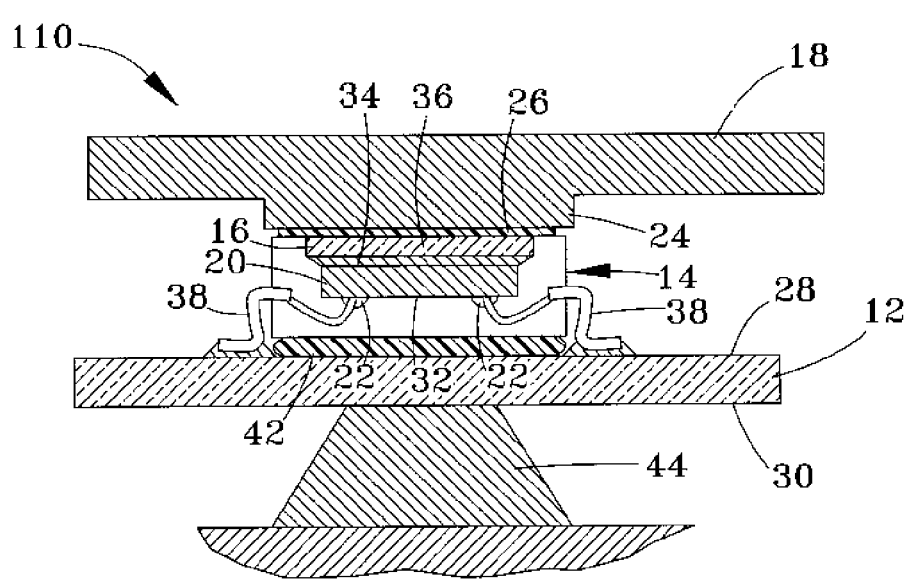
FIG. 3 is a cross-sectional view depicting a surface mount IC package with its I/O pads facing the substrate to which the package is electrically connected with leads, and with a heat conductor contacting the opposite side of the package for thermal management of the package in accordance with a second embodiment of the present invention.

As noted above, the circuit assembly 110 represented in FIG. 3 differs from the embodiment of FIG. 2 by reversing the orientation of the package 14, i.e., the surface 32 carrying the I/O pads 22 of the device 20 faces the substrate 12. With this orientation, the leads 38 contact the lower surface (32 as viewed in FIG. 3) of the device 20, instead of its upper surface (34 as viewed in FIG. 3). An advantage of this orientation is the ability to engage the heat conductor 16 (again located on the surface 34 of the device 20 opposite the I/O pads 22) with the heat sink 18 located above the package 14, instead of requiring a through-hole 40 through which the pedestal 24 of the heat sink 18 projects as done in FIG. 2. Another advantage is that a larger surface region of the package 14 can be directly bonded to the substrate 12 with the adhesive 42 to promote the solder joint interconnect life of the package interconnects. To promote thermal contact between the heat conductor 16 and the heat sink 18, FIG. 3 shows a biasing member 44 engaging the lower surface 30 of the substrate 12, in accordance with commonly-assigned U.S. Pat. No. 6,180,436, the relevant teachings of which are incorporated herein by reference. The biasing member 44 can be formed of an elastomeric material or be in the form of a mechanical spring, and can permit the use of a thermal grease or pad in place of the thermal contact material 26 used in FIG. 2 to bond the heat conductor 16 to the heat sink pedestal 24. Flexing of the substrate 12 by the biasing member 44 occurs to some degree to ensure good thermal contact, necessitating a sufficiently thin or otherwise flexible substrate material.

Figure 4:
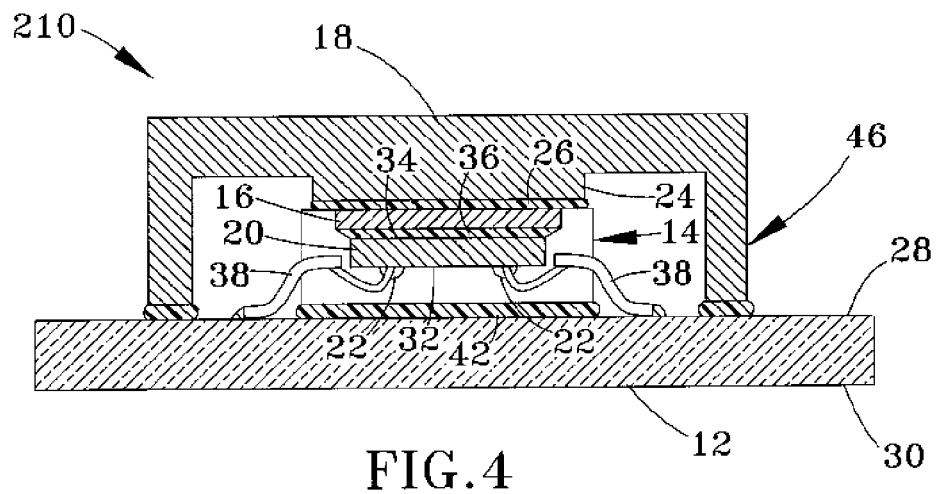
FIG. 4 is a cross-sectional view depicting a surface mount IC package with its I/O pads facing the substrate to which the package is electrically connected with leads, and with a heat conductor contacting the opposite side of the package and contacting a case for thermal management of the package in accordance with a third embodiment of the present invention.

The circuit assembly 210 represented in FIG. 4 primarily differs from the embodiment of FIG. 3 by forming the heat sink 18 as part of a casing 46 that completely encloses the package 14 on the surface 28 of the substrate 12. The casing 46 can be bonded to the substrate 12 with solder or a structural adhesive, such as an epoxy or filled epoxy known in the art. Because the heat conductor 16 is not biased into contact with the heat sink 18, the thermal contact material 26 is preferably a thermally conductive adhesive or solder.

Figure 5:
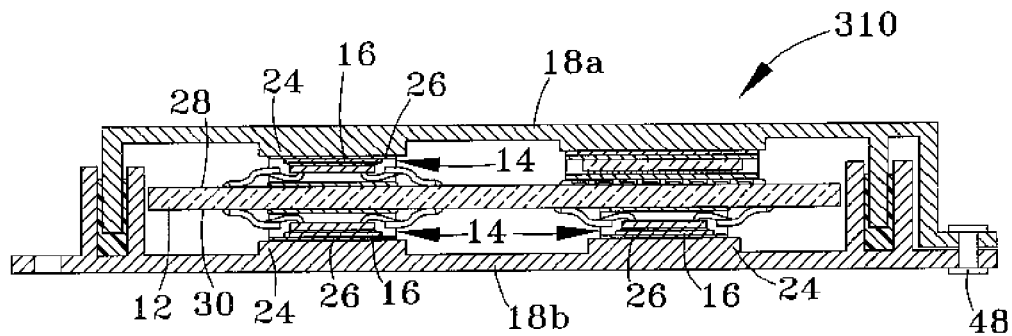
FIGS. 5 and 6 are cross-sectional and plan views, respectively, depicting a dual-sided PCB assembly with multiple surface mount IC packages with I/O pads facing the substrate to which the packages are electrically connected with leads, and with a heat conductor contacting the opposite side of each package and contacting a case for thermal management of the packages in accordance with a fourth embodiment of the present invention.
Figure 6:
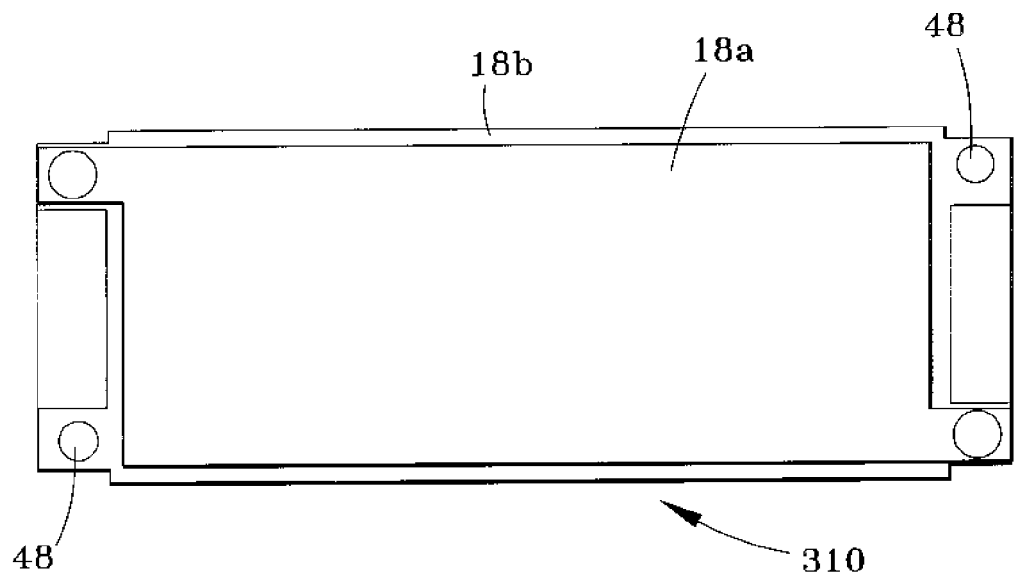

FIGS. 5 and 6 depict multiple packages 14 mounted to both surfaces 28 and 30 of the substrate 12, with the entire substrate and package assembly enclosed within a two-piece casing formed by casing halves 18a and 18b that each serve as a heat sink for packages 14 located on their respective sides of the substrate 12. The casing halves 18a and 18b are assembled and held together with fasteners 48 that determine the force applied by the halves 18a and 18b on the packages 14, as evident from FIG. 5. As with the embodiment of FIG. 3, the ability of the circuit assembly 310 to apply a controlled amount of contact force between the individual pairs of heat conductors 16 and pedestals 24 permits the use of a thermal grease or pad in place of an adhesive as the thermal contact material 26.

Figure 7:
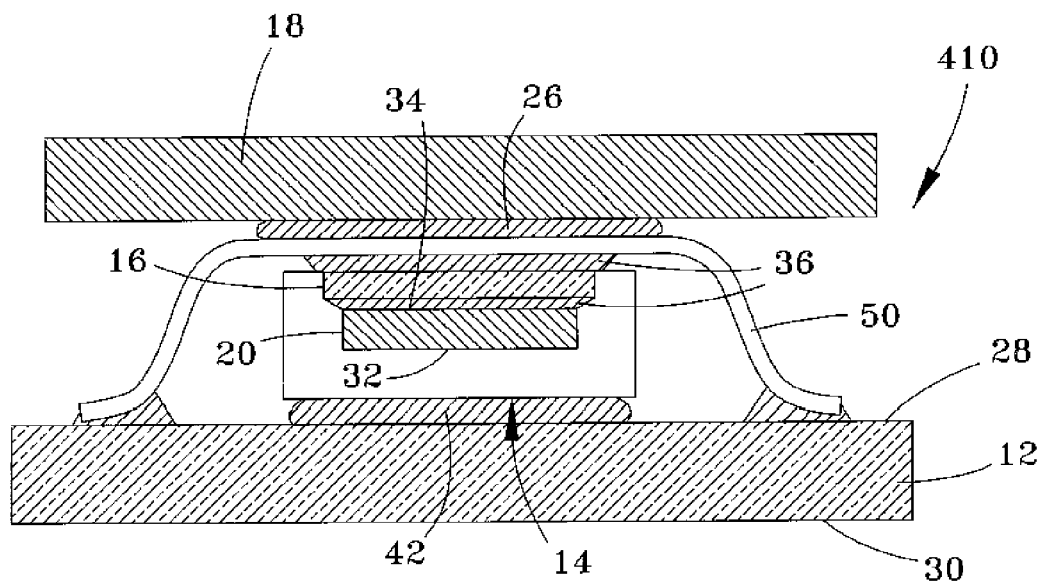
FIGS. 7 and 8 are cross-sectional views depicting a surface mount IC package with its I/O pads facing the substrate to which the package is electrically connected with leads, and a backside electrical contact equipped with a backside heat conductor for thermal management in accordance with a fifth embodiment of the present invention.
Figure 8:
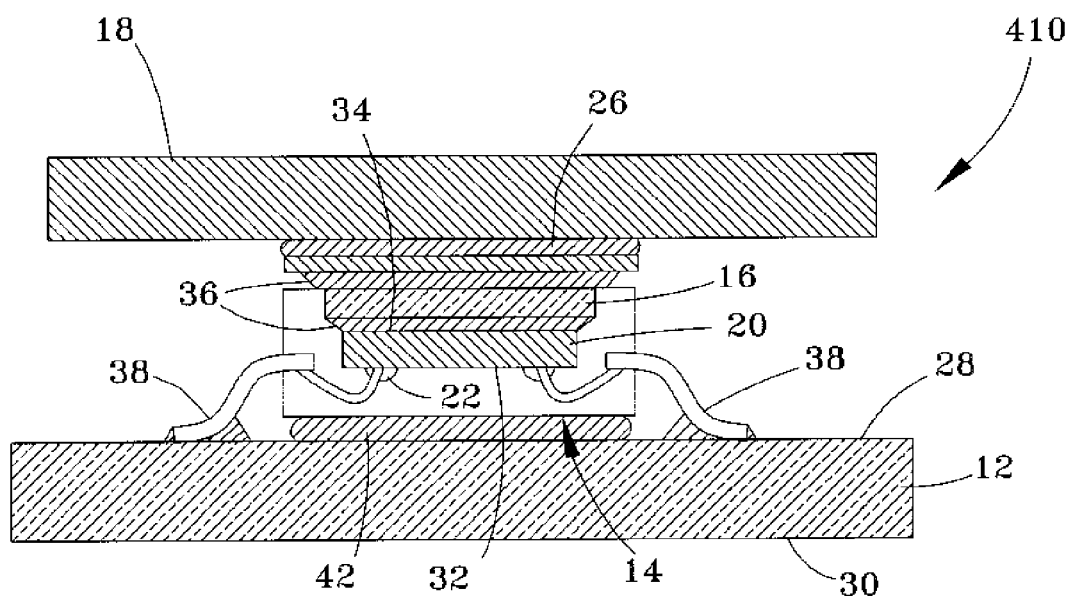

Finally, FIGS. 7 and 8 depict an embodiment in which the device 20 within the package 14 includes a vertical semiconductor device, necessitating a backside electrical contact (not shown) located on the backside surface 34 of the device 20. Consequently, in addition to the leads 38 electrically connecting the I/O pads 22 to conductors on the substrate surface 28 (as shown in the section of the assembly 410 represented by FIG. 8), the circuit assembly 410 includes backside leads 50 that electrically connect the backside electrical contact to one or more other conductors on the substrate surface 28 (as shown in a different section of the assembly 410 represented by FIG. 7). The heat conductor 16 is shown as forming part of the electrically conductive path from the backside electrical contact to the backside leads 50, and therefore must be bonded to the device 20 and the backside leads 50 with electrically conductive materials, such as solder 36. However, to electrically isolate the heat sink 18, the thermal contact material 26 between the heat conductor 16 and the heat sink 18 is preferably a thermal adhesive. Because the backside leads 50 are attached to the heat conductor 16 and the substrate 12, a CTE mismatch does not exist between the two and stress on the solder joints within the assembly 410 is minimal.

While our invention has been described in terms of a preferred embodiment, it is apparent that other forms could be adopted by one skilled in the art. Accordingly, the scope of our invention is to be limited only by the following claims.

What is claimed is:

1. A circuit assembly comprising:
    a substrate having oppositely-disposed first and second substrate surfaces and conductors on the first surface;
    at least one surface mount package comprising a package body having a first package surface and a second package surface, an integrated circuit device embedded in the package body and having input/output pads on a first surface thereof within the package, an oppositely-disposed second surface within the package and leads contacting the input/output pads within the package body and extending outside of the package body to electrically connect the input/output pads to the conductors on the first surface of the substrate, said package body being mounted upon the first substrate surface such that the first package surface is adjacent the first substrate surface;
    a metal heat sink adjacent the package and not separated from the package by the substrate; and a metal heat-conducting member contained within the package body adjacent the second surface of the circuit device, said heat-conducting member having a first surface bonded to the circuit device and a second surface coextensive with the second package surface and in thermal contact to the heat sink, whereby heat transfer from the circuit device to the heat sink is through the heat-conducting member.

2. The circuit assembly according to claim 1, wherein the first surface of the circuit device and the input/output pads thereon face the substrate, the package is bonded to the substrate, the heat-conducting member faces away from the substrate, and the package is between the substrate and the heat-conducting member.

3. The circuit assembly according to claim 2, wherein the heat-conducting member is directly bonded with solder to the circuit device and directly bonded with a thermally-conductive adhesive to the heat sink.

4. The circuit assembly according to claim 2, further comprising an adhesive bonding the package to the substrate.

* * * * *